(12) United States Patent
Lill et al.

(10) Patent No.: US 6,914,009 B2
(45) Date of Patent: Jul. 5, 2005

(54) METHOD OF MAKING SMALL TRANSISTOR LENGTHS

(76) Inventors: Thorsten B. Lill, 880 E. Fremont Ave., #634, Sunnyvale, CA (US) 94087; Jitske Kretz, 343 Henderson Dr., San Jose, CA (US) 95123

( * ) Notice: Subject to any disclaimer, the term of this patent is extended or adjusted under 35 U.S.C. 154(b) by 71 days.

(21) Appl. No.: 09/850,853

(22) Filed: May 7, 2001

(65) Prior Publication Data

US 2002/0164885 A1 Nov. 7, 2002

(51) Int. Cl.⁷ .............................................. H01L 21/302
(52) U.S. Cl. ........................ 438/711; 438/713; 438/717
(58) Field of Search ................................. 438/711, 713, 438/717, 752, 739, 738, 735, 753, 745, 719, 706

(56) References Cited

U.S. PATENT DOCUMENTS 3,977,925 A * 8/1976 Schwabe ..................... 156/13
5,155,657 A * 10/1992 Oehrlein et al. ............ 361/313

OTHER PUBLICATIONS

100nm Gate Length High Performance/Low Power CMOS Transistor Structure, T. Ghani et al, IEEE 1999, 4pp, Re–print No. 0–7803–5413–3/99.

* cited by examiner

Primary Examiner—W. David Coleman
(74) Attorney, Agent, or Firm—Moser, Patterson & Sheridan, NJ; Joseph Bach

(57) ABSTRACT

Transistor gate linewidths can be made to be effectively smaller by etching a notch at the bottom of the gate to reduce the effective linewidth. This can be done by etching at a layer interface, such as a silicon-germanium interface in an over-etch step.

12 Claims, 5 Drawing Sheets

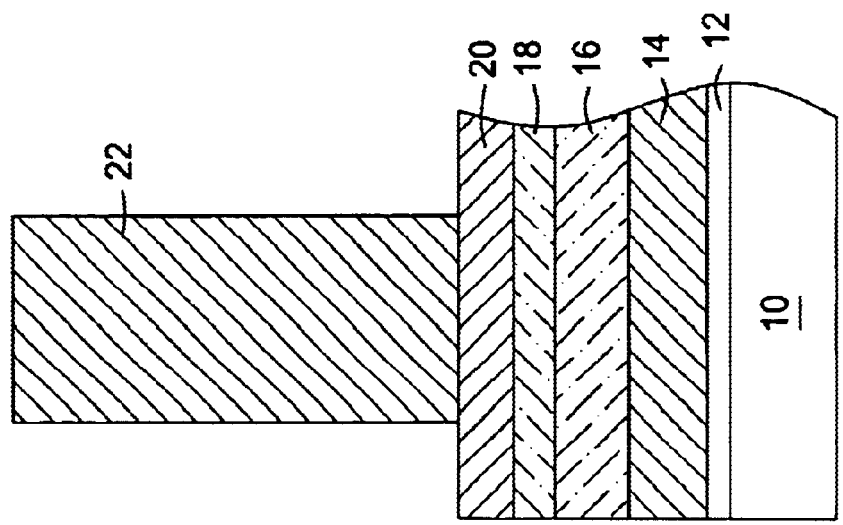
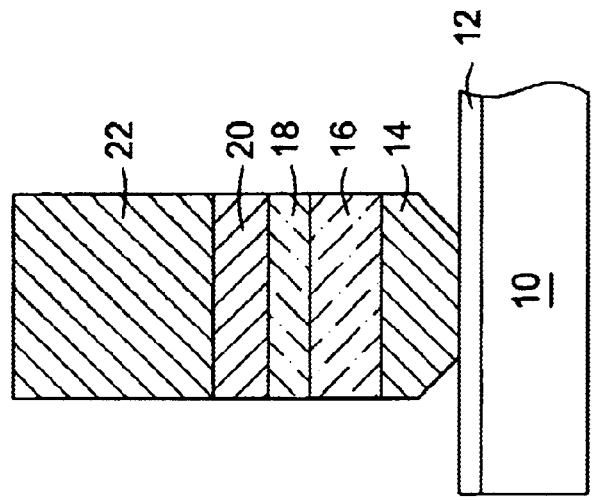

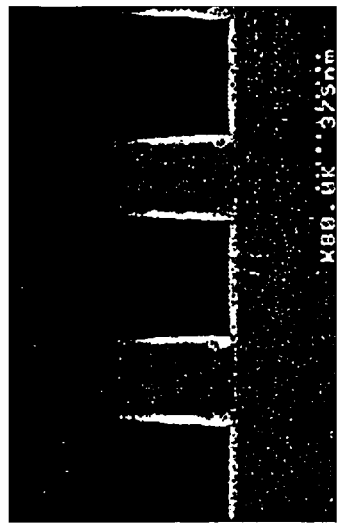
FIG. 5A
0 sccm CF$_4$
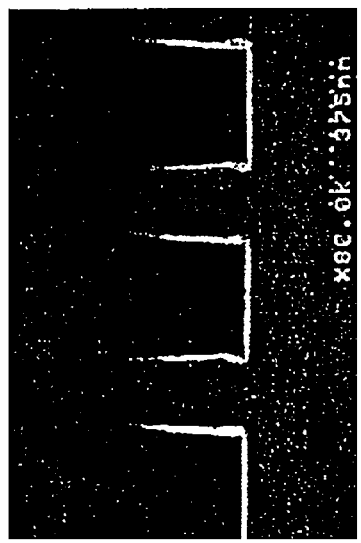
FIG. 5B
1 sccm CF$_4$
FIG. 5C
2 sccm CF$_4$
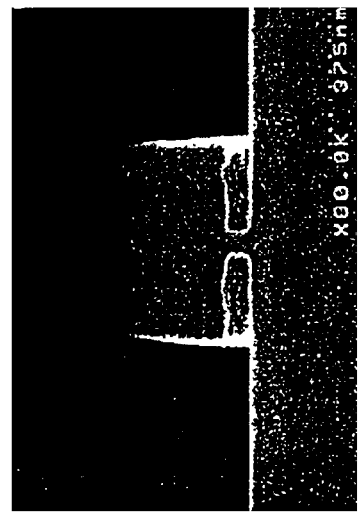
FIG. 6

METHOD OF MAKING SMALL TRANSISTOR LENGTHS

This invention relates to a method for forming small linewidth transistors. More particularly, this invention relates to forming very small apparent gate linewidths by etching a notch at the interface of a silicon-germanium stack.

BACKGROUND OF THE INVENTION

As the effective width of a gate stack becomes smaller, the transistors that can be made from them become faster. However, with present line widths at 0.25 micron, or even 0.18 micron, it is increasingly difficult to anisotropically etch through various layers of a small diameter gate stack. After forming the gate stack, the source and drain are ion implanted. The extra capacitance generated when the implants overlap the source and drain, acts to slow down the transistors. Thus the width of the gate should match, not overlap, the source and drain implants.

100 Nanometer (hereinafter nm) gate lines in CMOS transistors operating at 1.2–1.5V have been described. These transistors have high drive current, reporting a 10% improvement over existing technologies, with no change in the gate oxide thickness. In part, a notched polysilicon process is used to reduce the apparent gate polysilicon dimension by introducing a notch at the polysilicon-gate oxide interface. This notch enables a reduction in the total gate capacitance by reducing the gate length dimensions at the interface to 100 nm.

Germanium devices are faster than silicon devices because the mobility of their electrons is greater, and there are more of them. Thus transistors made using a silicon-germanium gate stack are of present interest.

It would be advantageous to reduce the effective gate width of transistor gates including a layer of germanium by forming a notch at the interface between a silicon layer and a germanium layer of a gate stack. In addition, a notch at the bottom of the gate would reduce the cooling capacity.

SUMMARY OF THE INVENTION

The present invention method forms a notch at the silicon-germanium interface of a gate stack that creates a very small apparent linewidth and preserves fast speeds for these transistors. The method comprises etching a multilayer gate stack in a single chamber, and over-etching the stack, forming a notch at the silicon-germanium interface. This over-etch step in effect narrows the width of the line, and eliminates some of the capacitance generated at the edge of the line where it overlaps the source and drain of the transistor.

BRIEF DESCRIPTION OF THE DRAWING

FIG. 1A illustrates a film stack to be processed in accordance with the present invention.

FIG. 1B illustrates a film stack after processing in accordance with the present invention wherein a notch is formed at the germanium layer.

FIGS. 5A, 5B and 5C illustrate openings made by varying the amount of fluorocarbon present in the etch gas.

FIG. 6 illustrates an opening made using a wet etch treatment.

DETAILED DESCRIPTION OF THE INVENTION

Figure 2:
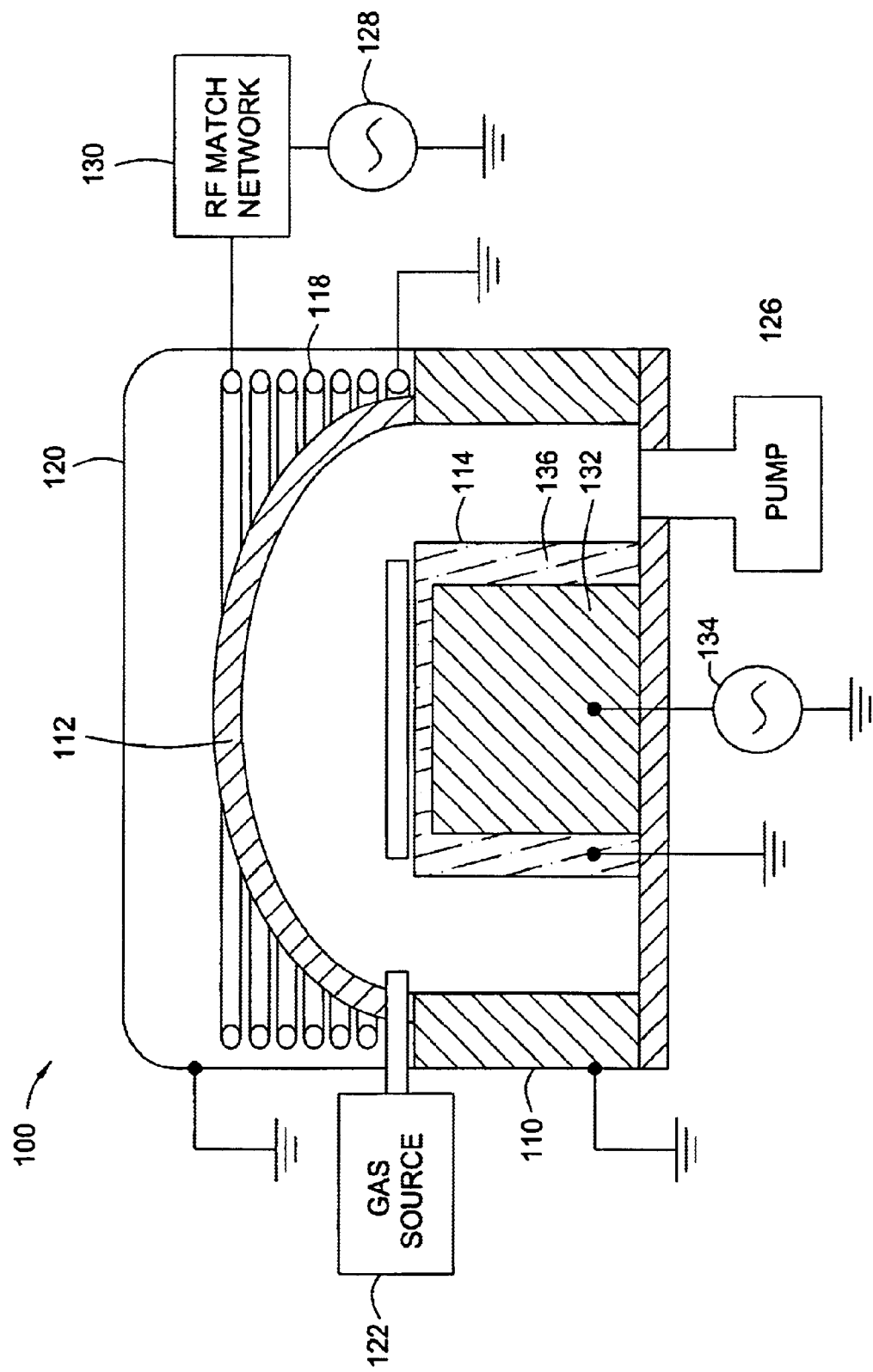
FIG. 2 is a cross sectional view of a chamber suitable for carrying out a sequence of etch steps in the chamber.

A typical gate stack for processing herein is shown in FIG. 1. A crystalline silicon substrate 10 has sequentially deposited thereover a layer of gate oxide 12 about 50 angstroms thick; a layer of amorphous germanium 14 about 600 angstroms thick; a layer of amorphous silicon 16 about 1400 angstroms thick; a layer of PECVD silicon oxide 18 about 800 angstroms thick; and a bottom antireflection layer 20 about 1140 angstroms thick. A patterned layer of a deep ultraviolet photoresist 22 about 8000 angstroms thick is deposited and patterned to a cross section of about 0.18 micron in diameter.

A suitable chamber for etching through all of the above film layers sequentially is shown in FIG. 2. This chamber is referred to as a decoupled plasma source (DPS) chamber.

Ths inductively coupled RF plasma reactor includes a reactor chamber 100 having a grounded conductive cylindrical sidewall 110 and a dielectric ceiling 112, e.g., flat or dome-like. The reactor includes a substrate support electrode 114 for supporting a substrate 116 to be processed in the chamber 100; a cylindrical inductor coil 118 surrounding an upper portion of the chamber beginning near the plane of the top of the substrate 116 or substrate support electrode 114 and extending upwardly therefrom toward the top of the chamber 100; a process gas source 122 and a gas inlet 124, which can be a plurality of inlets spaced about the interior of the chamber 100; and a pump 126 for controlling the chamber pressure. The coil inductor 118 is energized by a plasma source power supply, or RF generator 128, through a conventional active RF match network 130, the top winding of the inductor coil 118 being "hot" and the bottom winding being grounded. Alternatively, a flat coil can be used. The substrate support electrode 114 includes an interior conductive portion 132 connected to a bias RF power supply or generator 134, and an exterior grounded conductor 136 which is insulated from the interior conductive portion 132. A conductive grounded RF shield 120 surrounds the coil inductor 118.

To carry out the present process, the source power is turned on and a fluorocarbon or hydrofluorocarbon processing gas is passed into the chamber 100 from the desired gas containers (not shown). The fluorocarbon gas deposits a polymer onto the photoresist layer to protect it during the multiple etch steps to follow.

The power to the chamber 100 from the inductive RF power source 128 is suitably from about 200 up to about 3000 watts, and is preferably from about 500 to 2000 watts. The RF source can be a 12.56 MHz power source. No bias power is used during the deposition step. The pressure in the chamber during this step is maintained at about 40 millitorr.

Suitable fluorocarbon gases include polymer-generating gases such as $CHF_3$; $C_2F_6$; $C_4F_6$; $C_4F_8$; $C_5F_8$ and the like. Such gases form a fluorocarbon, polytetrafluoroethylene-like coating on the photoresist, protecting the photoresist during the subsequent etch steps. The deposition step is generally carried out for about five seconds.

During the etch steps, the various layers are etched as described further hereinbelow.

The bottom antireflection layer is etched using hydrogen bromide, oxygen and an argon carrier gas at low pressure, comparatively low source power and comparatively high bias power. This etch is monitored using a known optical laser endpoint detection system.

The PECVD silicon oxide layer is etched using argon, oxygen and a fluorocarbon, at somewhat higher pressure and bias power. This endpoint is monitored using a suitable endpoint detector.

The amorphous silicon layer is etched using a mixture of hydrogen bromide and oxygen, at somewhat higher pressure and source power but somewhat lower bias power. This endpoint is monitored using a suitable endpoint detection system.

The germanium layer is etched using the same etchant gases as for amorphous silicon, but at higher pressure, higher source power and higher bias power.

Thus all of the layers can be etched in the same chamber simply by changing the etch gas mixtures and the power and pressure in the chamber.

The substrate can be cooled during etch processing, generally by means of a coolant passed to a channel in the substrate support electrode 114 (not shown). In addition, a flow of a coolant gas, such as helium, can be passed between the substrate 116 and the substrate support 114 to enhance cooling and maintain the temperature of the substrate within the desired range, generally from about 10 to about 100° C.

After completing the etch, a resist removal step is used to strip the remaining resist and to notch the gate structure.

The present method is further explained in the following Examples. However, the invention is not meant to be limited by the details described therein.

EXAMPLE 1

After patterning the photoresist layer as shown in FIG. 1, the various layers are etched as follows:

The bottom antireflection coating (BARC) layer is etched using HBr, argon, and oxygen in a gas flow ratio of about 4:2:1. The chamber pressure was maintained at 4 millitorr, the source power was 500 watts, the bias power was 120 watts. The cathode temperature was kept at 50° C. with a backside pressure of helium of 8 torr for all of the etch steps. The wavelength monitored by the endpoint detector was 4705 angstroms.

The silicon oxide layer was etched using argon, carbon tetrafluoride and oxygen at a gas flow ratio of about 30:20:1 at a chamber pressure of 5 millitorr. The source power was 500 watts and the bias power was 135 watts. The etch endpoint was monitored using a wavelength of 2880 angstroms.

Figure 3:
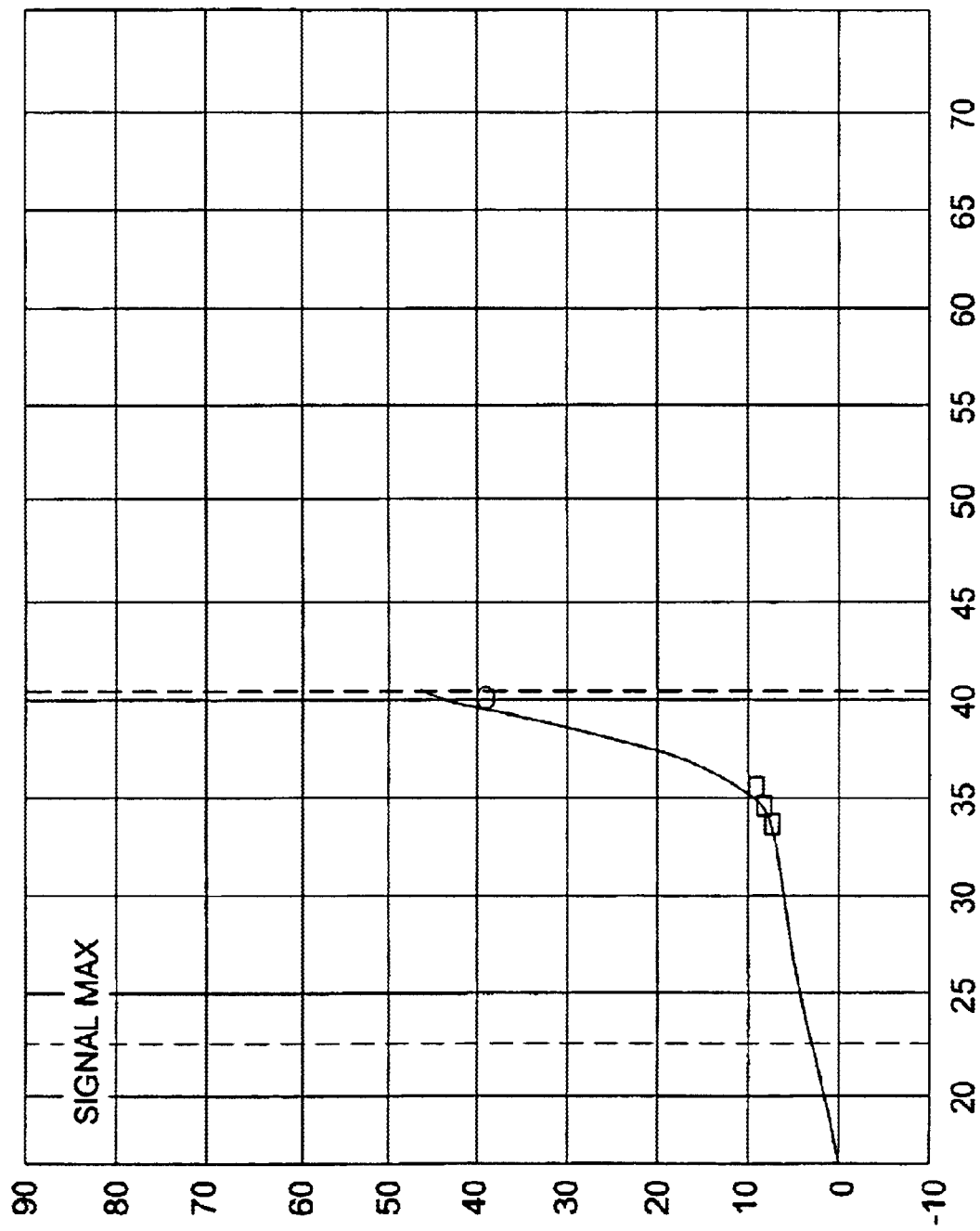
FIG. 3 is a graph of an emission endpoint taken at 3040 angstroms at the silicon-germanium interface.

The amorphous silicon layer was then etched with HBr and oxygen at a gas flow ratio of 60:1 and a pressure of 6 millitorr. The source power used was 700 watts, the bias power 60 watts. The etch was monitored using a detection wavelength of 3040 angstroms. FIG. 3 illustrates the emission endpoint for the silicon-germanium interface. The etch was stopped at the endpoint, permitting a repeatable soft landing for this etch.

The germanium layer was etched using the same etch gases, but increasing the pressure to 55 millitorr, the source power to 950 watts and reducing the bias power to 70 watts. This etch was carried out for 30 seconds.

Figure 4B:
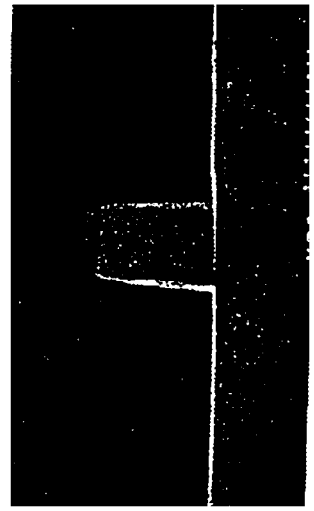
FIG. 4B illustrates openings etched in accordance with the invention taken at the edge of the substrate.
Figure 4D:
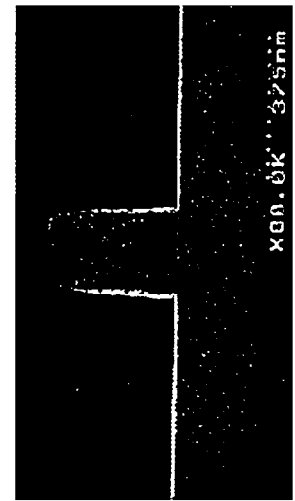
FIGS. 4C and 4D illustrate the etched profiles at the edge of a wafer in accordance with one or more embodiments of the invention.
Figure 4A:
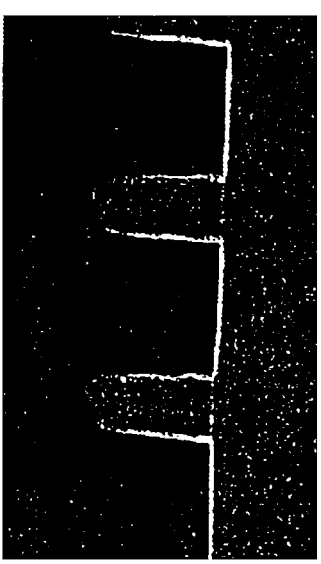
FIG. 4A illustrates openings etched in accordance with the invention taken at the center of the substrate.
Figure 4C:
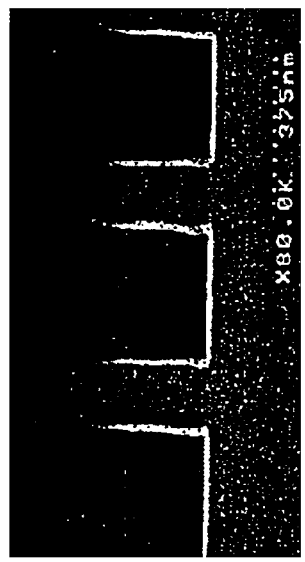

The resultant etched profiles are shown in FIGS. 4A and 4B for the center of the wafer. FIGS. 4C and 4D show the etched profiles at the edge of the wafer. Very little notching is apparent.

The main etch is stopped after etching the silicon and germanium layers, but before reaching the thin gate oxide layer. In order to achieve a "soft landing", the main etch is terminated before reaching the thin gate oxide layer. An over-etch is carried out to remove the remaining germanium under the following conditions: gas flows of HBr and oxygen at a gas flow ratio of 60:1 and optional carbon tetrafluoride. The pressure was 55 millitorr, the source power was 950 watts, and the bias power was 70 watts, for 60 seconds.

FIG. 5A illustrates the profile obtained when no carbon tetrafluoride was added. FIG. 5B illustrates the profile obtained when carbon tetrafluoride was added to the etchant gases at a gas flow ratio of 60:1:0.5. FIG. 5C illustrates the profile obtained when carbon tatrafluoride was added to the etchant gases at a gas flow rate of 60:1:1. It is apparent that adding increasing amounts of carbon tetrafluoride increases notching at the silicon-germanium interface to provide a controllable etch.

EXAMPLE 2

After etching openings in the various layers as in FIG. 1, the silicon wafer was dipped in a cleaning solution for 10 minutes. The resultant overetch is shown in FIG. 6. It can be seen that the notch was opened almost through the width of the line and is difficult to control.

After completing the etch, a photoresist removal step was used to strip the remaining resist and to notch the gate structure.

The strip/notch step can also be carried out using a hydrofluorocarbon in place of, or in addition to, the fluorocarbon together with oxygen, or by using chlorine and oxygen, or using a mixture of chlorine, hydrogen bromide and oxygen.

Isotropic plasma etch stripping is shown to be more controllable as a post etch treatment than wet etching to recess the germanium layer at the germanium-oxide interface and reduce $l_{eff}$. Depending on the etch time and the amount of fluorocarbon employed, a very controllable overetch step can produce line widths at the silicon-germanium interface that are very small. However, the overall width of the line is not affected very much, and thus the conductivity of the gate line is preserved.

Any etchant that includes water also works very well. Liquid water, water vapor, or a water plasma can be employed. The latter method is preferred because it can be readily controlled. If the over-etch is continued too far, the germanium layer will be etched through, thereby removing the gates.

Thus the over-etch step to form a notch at the silicon-germanium interface can be carried out by dipping in liquid water for about one minute; by exposing it to water vapor, or by using an oxygen-containing plasma.

When making transistors, notching reduces the capacitance which develops after ion implantation and drive-in of the source and drain, which in turn slows down the transistor speeds. To further improve transistor speed, the ion implants should be made as close as possible to the germanium layer.

Although the invention has been described in terms of specific embodiments, other etchants, reaction conditions, etch chambers and layers can be substituted as will be known to one skilled in the art. These substitutions are meant to be included within the scope of the invention, which is only to be limited by the scope of the appended claims.

What is claimed is:

1. In a plasma etch process for etching a silicon layer and a germanium layer over a gate oxide layer, the improvement comprising carrying out a controllable over-etch of the germanium layer using an etchant of a mixture of hydrogen bromide, oxygen and fluorocarbon to etch a notch at the silicon-germanium interface.

2. A method of forming transistor gates having effective linewidths of 100 nm or less from a gate stack comprising in sequence a plasma enhanced chemical vapor deposited silicon oxide layer, an amorphous silicon layer and a germanium layer over a gate oxide layer, comprising:

anisotropic plasma etching through the plasma enhanced chemical vapor deposited silicon oxide layer, the amorphous silicon layer and the germanium layer; and over-etching the germanium layer using an etchant comprising a mixture of hydrogen bromide, oxygen and fluorocarbon so as to controllably form a notch at the silicon-germanium interface.

3. A method according to claim 2, wherein the etch steps are carried out sequentially in a single etch chamber.

4. A method according to claim 2, wherein the etchant includes a hydrofluorocarbon and oxygen.

5. A method according to claim 2 wherein the etchant includes chlorine and oxygen.

6. A method according to claim 2 wherein the etchant includes chlorine, hydrogen bromide and oxygen.

7. A method according to claim 2 wherein the etchant includes water.

8. A method of forming transistor gates having effective linewidths of 100 nm or less from a gate stack comprising in sequence a plasma enhanced chemical vapor deposited silicon oxide layer, an amorphous silicon layer and a germanium layer over a gate oxide layer, comprising:

anisotropic plasma etching through the plasma enhanced chemical vapor deposited silicon oxide layer, the amorphous silicon layer and the germanium layer; and controllably over-etching the germanium layer using an etchant comprising a mixture that includes chlorine and oxygen.

9. A method according to claim 8 wherein the etchant further includes hydrogen bromide.

10. A method according to claim 8 wherein the etchant further includes water.

11. A method according to claim 8 wherein the etchant further includes a hydrofluorocarbon.

12. A method according to claim 2 wherein said fluorocarbon is a hydrofluorcarbon.

* * * * *

UNITED STATES PATENT AND TRADEMARK OFFICE
CERTIFICATE OF CORRECTION

PATENT NO. : 6,914,009 B2
APPLICATION NO. : 09/850853
DATED : July 5, 2005
INVENTOR(S) : Thorsten B. Lill and Jitske Kretz It is certified that error appears in the above-identified patent and that said Letters Patent is hereby corrected as shown below:

Column 2, Line 25: Change "Ths" to --This--

Column 4, Line 15: Change "tatrafluoride" to --tetrafluoride--

Column 6, Claim 12, Line 23: Change "hydrofluorcarbon" to --hydrofluorocarbon--

Signed and Sealed this

Twenty-second Day of August, 2006

JON W. DUDAS
*Director of the United States Patent and Trademark Office*

UNITED STATES PATENT AND TRADEMARK OFFICE
CERTIFICATE OF CORRECTION

PATENT NO. : 6,914,009 B2  
APPLICATION NO. : 09/850853  
DATED : July 5, 2005  
INVENTOR(S) : Thorsten B. Lill and Jitske Kretz It is certified that error appears in the above-identified patent and that said Letters Patent is hereby corrected as shown below:

On the Title of the Patent

Add Item --73 Assignee: Applied Materials, Inc., P.O. Box 450-A, Santa Clara, CA 95052--

In the Specification

Column 2, Line 25: Change "Ths" to --This--

Column 4, Line 15: Change "tatrafluoride" to --tetrafluoride--

In the Claims

Column 6, Claim 12, Line 23: Change "hydrofluorcarbon" to --hydrofluorocarbon--

Signed and Sealed this

Twenty-ninth Day of May, 2007

JON W. DUDAS  
*Director of the United States Patent and Trademark Office*